US007449928B2

(12) United States Patent
Kobayashi (10) Patent No.: US 7,449,928 B2
(45) Date of Patent: Nov. 11, 2008

(54) SEMICONDUCTOR DEVICE (75) Inventor: Hiroyuki Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 11/622,214

(22) Filed: Jan. 11, 2007

(65) Prior Publication Data
US 2007/0188251 A1 Aug. 16, 2007

(30) Foreign Application Priority Data
Jan. 12, 2006 (JP) ............................. 2006-004715

(51) Int. Cl.
*H03L 7/06* (2006.01)
(52) U.S. Cl. ..................... 327/156; 327/147; 327/148; 327/149; 327/150; 327/151; 327/152; 327/153; 327/157; 327/159; 327/160; 327/161
(58) Field of Classification Search ......... 327/147–153, 327/156–157, 159–161
See application file for complete search history.

(56) References Cited

U.S. PATENT DOCUMENTS

| 5,986,485 | A | * | 11/1999 | O'Sullivan | ................. | 327/156 |
| 6,154,071 | A | * | 11/2000 | Nogawa | ..................... | 327/156 |
| 6,853,223 | B2 | * | 2/2005 | Ebuchi et al. | ............... | 327/156 |
| 7,132,896 | B2 | * | 11/2006 | Boerstler et al. | ............. | 331/16 |
| 2004/0263224 | A1 | * | 12/2004 | Schrodinger | ................ | 327/156 |

FOREIGN PATENT DOCUMENTS

JP 11-073739 3/1999
JP 2001-119297 4/2001

OTHER PUBLICATIONS

Cassia, A Spur-Free Fractional-N PLL for GSM Applications: Linear Model and Simulations.

* cited by examiner

*Primary Examiner*—N. Drew Richards
*Assistant Examiner*—Adam Houston
(74) *Attorney, Agent, or Firm*—Amin, Turocy & Calvin, LLP (57) ABSTRACT

According to the present invention, there is provided a semiconductor device including: a phase locked loop circuit having, a phase frequency detector which receives a reference signal and a frequency-divided signal, and outputs a phase difference detection signal by performing phase comparison, a charge pump which receives the phase difference detection signal and outputs a charge pump signal by converting a voltage change into a current change, a loop filter which receives the charge pump signal, and outputs a control voltage by passing components having frequencies not more than a predetermined frequency, a voltage controlled oscillator which outputs a frequency signal having a frequency based on the control voltage, and a frequency divider which receives the frequency signal, and outputs the frequency-divided signal by dividing the frequency; a mask signal generator which generates a mask signal masking a timing at which the phase frequency detector compares phases of the frequency-divided signal and the reference signal; a lock detector which detects a locked state of the phase locked loop circuit and outputs a lock detection signal; and an isolating circuit which receives the mask signal and the lock detection signal, and electrically isolates the output of the loop filter and the input of the voltage controlled oscillator from each other upon phase comparison in the locked state.

18 Claims, 8 Drawing Sheets

SEMICONDUCTOR DEVICE

CROSS REFERENCE TO RELATED APPLICATION

This application is based upon and claims benefit of priority under 35 USC §119 from the Japanese Patent Application No. 2006-4715, filed on Jan. 12, 2006, the entire contents of which are incorporated herein by reference.

BACKGROUND OF THE INVENTION

The present invention relates to a semiconductor device.

A phase locked loop (to be referred to as a PLL hereinafter) circuit can obtain a frequency signal having a desired frequency with high accuracy by detecting a phase difference between a reference signal as a reference and an output frequency signal from a voltage controlled oscillator by using a phase frequency detector.

In a locked state in which the output frequency of the frequency signal is stable, the reference signal and frequency signal are in phase with each other, and the output from the phase frequency detector is ideally zero.

A generally used phase frequency detector, however, has a configuration in which a flip-flop for receiving the reference signal and a flip-flop for receiving the frequency signal are reset on the basis of the outputs from these two flip-flops. Even in the locked state, therefore, the phase frequency detector actually generates an output signal.

A charge pump circuit connected to the output of the phase frequency detector converts the signal generated by the phase frequency detector in this locked state into an electric current, thereby generating a control voltage containing a periodic fluctuation component. The voltage controlled oscillator converts the frequency of this control voltage to generate a spur in the output frequency.

A reference disclosing the conventional PLL circuit is as follows.

Japanese Patent Laid-Open No. 2001-119297

SUMMARY OF THE INVENTION

According to one aspect of the invention, there is provided a semiconductor device comprising:

a phase locked loop circuit having a phase frequency detector which receives a reference signal and a frequency-divided signal, and outputs a phase difference detection signal between the reference signal and the frequency-divided signal, a charge pump which receives the phase difference detection signal and outputs a charge pump signal by converting a voltage change into a current change, a loop filter which receives the charge pump signal, and outputs a control voltage by passing frequencies not more than a predetermined frequency, a voltage controlled oscillator which outputs a frequency signal having a frequency based on the control voltage, and a frequency divider which receives the frequency signal, and outputs the frequency-divided signal by dividing the frequency;

a mask signal generator which generates a mask signal masking a timing at which said phase frequency detector compares phases of the frequency-divided signal and the reference signal;

a lock detector which detects a locked state of said phase locked loop circuit and outputs a lock detection signal; and an isolating circuit which receives the mask signal and the lock detection signal, and electrically isolates the output of said loop filter and the input of said voltage controlled oscillator from each other upon phase comparison in the locked state.

According to one aspect of the invention, there is provided a semiconductor device comprising:

a phase locked loop circuit having a phase frequency detector which receives a reference signal and a frequency-divided signal, and outputs a phase difference detection signal between the reference signal and the frequency-divided signal, a charge pump which receives the phase difference detection signal and outputs a charge pump signal by converting a voltage change into a current change, a loop filter which receives the charge pump signal, and outputs a control voltage by passing frequencies not more than a predetermined frequency, a voltage controlled oscillator which outputs a frequency signal having a frequency based on the control voltage, and a frequency divider having at least a single-stage counter which receives the frequency signal, divides the frequency by counting the frequency, and outputs the frequency-divided signal;

a mask signal generator which generates a mask signal masking a timing at which said phase frequency detector compares phases of the signal from said frequency divider and the reference signal, in synchronism with one of the frequency signal from said voltage controlled oscillator and the signal generated by said frequency divider;

a lock detector which detects a locked state of said phase locked loop circuit and outputs a lock detection signal;

a logic circuit which receives the mask signal and the lock detection signal, and passes the mask signal in the locked state; and a switching element formed between an output terminal of said loop filter and an input terminal of said voltage controlled oscillator, and turned on and off on the basis of the mask signal output from said logic circuit, wherein said loop filter and said voltage controlled oscillator are isolated from each other upon phase comparison in the locked state so as not to apply the control voltage to said voltage controlled oscillator.

DETAILED DESCRIPTION OF THE INVENTION

Embodiments of the present invention will be explained below with reference to the accompanying drawings.

FIRST EMBODIMENT

Figure 1:
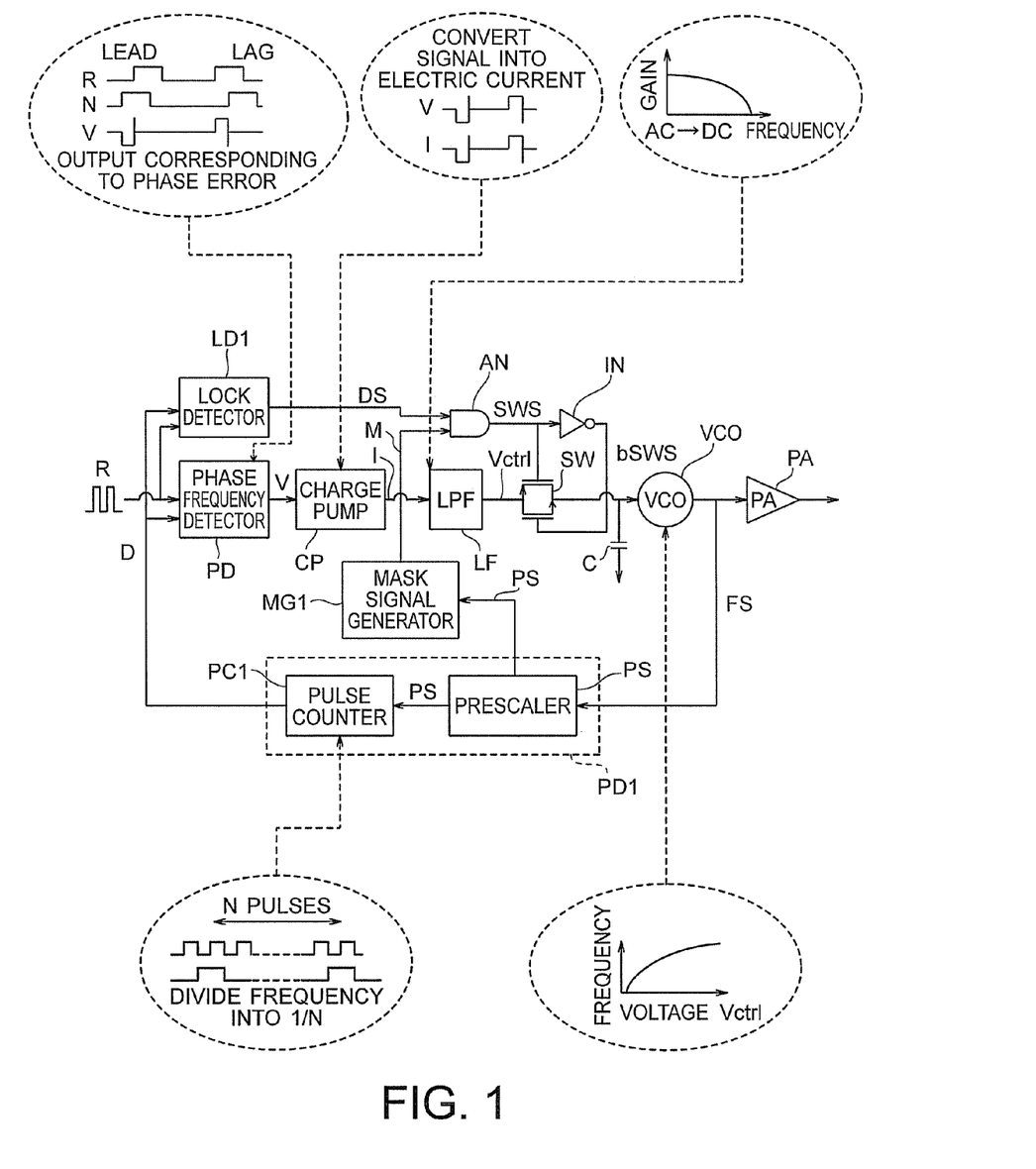
FIG. 1 is a block diagram showing the configuration of a semiconductor device according to the first embodiment of the present invention.
Figure 2:
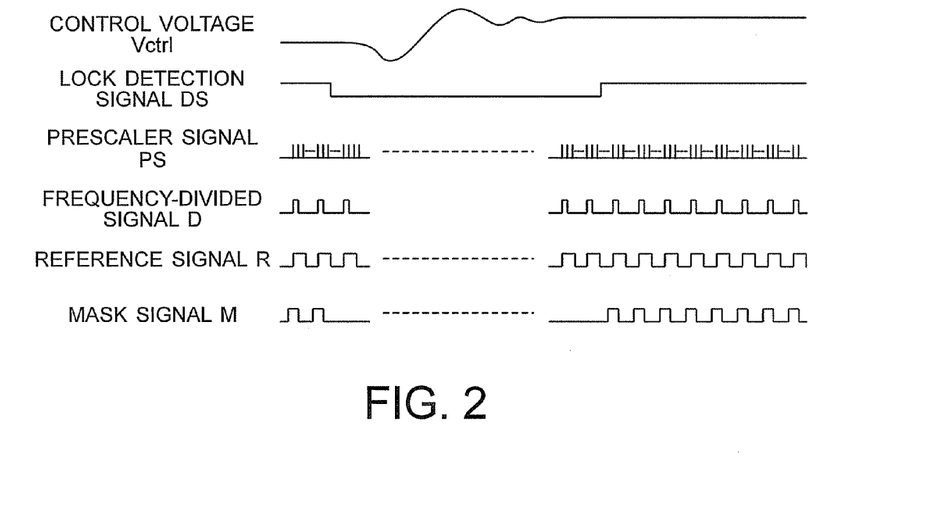
FIG. 2 is a timing chart showing the operation waveforms of individual signals in the semiconductor device shown in FIG. 1.

FIG. 1 shows the configuration of a semiconductor device according to the first embodiment. FIG. 2 is a timing chart showing the waveforms of a control voltage Vctrl, lock detection signal DS, prescaler signal PS, frequency-divided signal D, reference signal R, and mask signal M (to be described later) in the semiconductor device. This timing chart represents an example when the control voltage Vctrl is changed from a certain voltage to a higher voltage.

This semiconductor device comprises a PLL circuit including a phase frequency detector PD, charge pump CP, loop filter LF, voltage controlled oscillator VCO, programmable frequency divider PD1, and preamplifier PA, and further comprises a lock detector LD1, mask signal generator MG1, switching element SW, AND circuit AN, and inverter IN.

The phase frequency detector PD receives the frequency-divided signal D and the reference signal R having a reference frequency, and outputs a phase difference detection signal V corresponding to a lag, coincidence, or lead of the phase of the frequency-divided signal D with respect to the reference signal R.

The charge pump CP outputs a charge pump signal I by converting a change in voltage of the phase difference detection signal V into a change in electric current.

The loop filter LF receives the charge pump signal I and outputs a control voltage Vctrl by attenuating frequency components equal to or higher than a predetermined frequency.

A switching signal SWS from the AND circuit AN and an inverted switching signal bSWS obtained by inverting the switching signal by the inverter IN control ON/OFF of the switching element SW, thereby passing or interrupting the control voltage Vctrl.

A capacitor C removes harmonic noise components from the control voltage Vctrl passing through the switching element SW. After that, the control voltage Vctrl enters the voltage controlled oscillator VCO.

The voltage controlled oscillator VCO generates a frequency signal FS having a frequency corresponding to the voltage value of the control voltage Vctrl, and outputs the frequency signal FS to the programmable frequency divider PD1 and preamplifier PA.

The preamplifier PA performs predetermined amplification on the frequency signal, and outputs the amplified signal to a subsequent circuit (not shown).

The programmable frequency divider PD1 causes the prescaler PS equivalent to a first-stage high-speed counter to lower the frequency of the frequency signal FS to a certain degree and output a prescaler signal PS. Then, the programmable frequency divider PD1 causes the pulse counter PC1 equivalent to a second-stage counter to generate one pulse for every N (N is an integer of 2 or more) pulses of the prescaler signal PS and output a frequency-divided signal D.

The lock detector LD1 compares the frequency-divided signal D with the reference signal R, and outputs a High-level lock detection signal DS if the PLL circuit is in a locked state in which the frequency of the frequency signal FS is stable, or a Low-level signal if the PLL circuit is not in the locked state.

The mask signal generator MG1 outputs a mask signal M having a predetermined pulse width so as to cover (mask) the timing at which the phase frequency detector PD compares the phase of the frequency-divided signal D with that of the reference signal R. Since the frequency-divided signal D to be compared is generated from the prescaler signal PS output from the prescaler PS, the mask signal M can be output by generating a signal which masks the leading or trailing edge of the prescaler signal PS. The mask signal M is a signal for isolating the control voltage Vctrl output from the loop filter LF from the voltage controlled oscillator VCO.

The AND circuit AN receives the lock detection signal DS and mask signal M. The AND circuit AN outputs a High-level switching signal SWS when receiving the High-level lock detection signal DS indicating that the PLL circuit is in the locked state, and the High-level mask signal masking the timing at which the phase frequency detector PD compares the phase of the frequency-divided signal D with that of the reference signal R.

The High-level switching signal SWS turns off the switching element SW having a p-channel transistor whose gate receives this signal, and an n-channel transistor whose gate receives the inverted switching signal bSWS. Consequently, the control voltage Vctrl output from the loop filter LF is interrupted by the switching element SW and is not output to the voltage controlled oscillator VCO.

On the other hand, the AND circuit AN outputs a Low-level switching signal SWS if the AND circuit AN receives at least one of the Low-level lock detection signal DS indicating that the PLL circuit is not in the locked state, and the Low-level mask signal masking the timing at which the phase frequency detector PD compares the phase of the frequency-divided signal D with that of the reference signal R. This turns on the switching element SW. In this case, the control voltage Vctrl output from the loop filter LF passes through the switching element SW and enters the voltage controlled oscillator VCO.

As described above, if the frequency-divided signal D and reference signal R are not in phase with each other, the AND circuit AN ANDs the mask signal M and lock detection signal DS to turn on the switching element SW by cancellation.

Consequently, the control voltage Vctr1 output from the loop filter LF can be applied to the voltage controlled oscillator VCO as in a normal operation.

In only the locked state, therefore, the control voltage Vctr1 is isolated at the moment of phase comparison so as not to be applied to the voltage controlled oscillator VCO. This suppresses the generation of a spur.

The capacitor C is formed between the input terminal of the voltage controlled oscillator VCO and the ground terminal. The capacitor C suppresses fluctuations in control voltage Vctr1 caused by the movement of an electric charge upon switching of the switching element SW.

By decreasing the size of transistors forming the switching element SW to a certain degree, it is possible to decrease the size of the capacitor C compared to a case in which a third-order filter is assembled, and obviate the need to form a resistor.

Also, the control voltage Vctr1 is isolated only when phase comparison is performed in the locked state, so as not to be applied to the voltage controlled oscillator VCO. Therefore, when compared to a case in which the control voltage Vctr1 containing fluctuation components produced upon phase comparison is always applied to the voltage controlled oscillator VCO, it is possible to decrease the capacitor forming the loop filter while the loop band is held constant (RC=constant), thereby reducing the circuit area.

FIRST REFERENCE EXAMPLE

Figure 3:
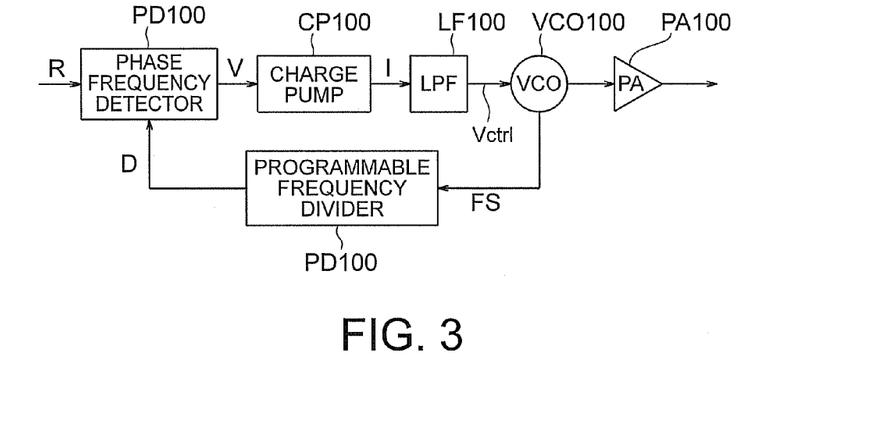
FIG. 3 is a block diagram showing a semiconductor device according to the first reference example.

For comparison with the first embodiment described above, a semiconductor device according to the first reference example will be explained below with reference to FIG. 3 showing the configuration of the device.

This device includes a phase frequency detector PD100, charge pump CP100, low-pass filter LF100, voltage controlled oscillator VCO100, preamplifier PA100, and programmable frequency divider PD100, and operates as a PLL circuit.

The first reference example does not include that arrangement of the first embodiment which isolates the control voltage Vctr1 upon phase comparison in the locked state so as not to apply the control voltage Vctr1 to the voltage controlled oscillator VCO.

Figure 4:
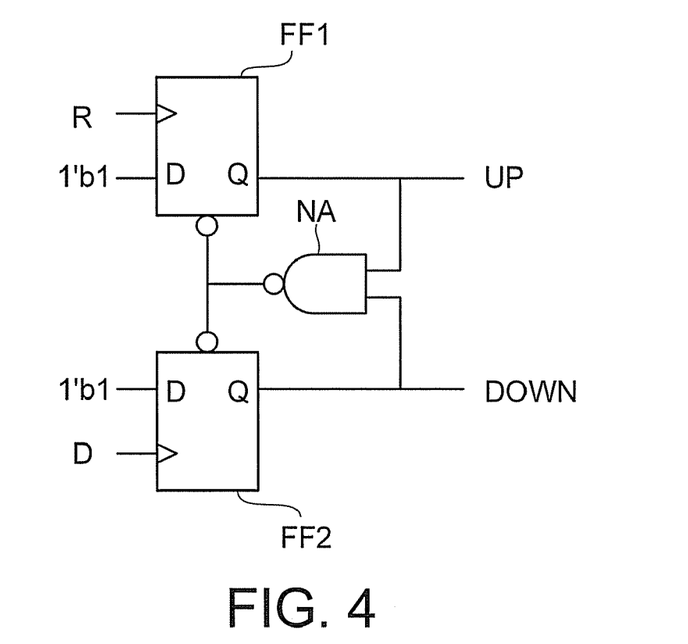
FIG. 4 is a block diagram showing the configuration of a phase frequency detector in the semiconductor device shown in FIG. 3.

FIG. 4 shows a generation arrangement of the phase frequency detector PD. Flip-flops FF1 and FF2 receive High-level signals I'b1 at their data terminals D, and respectively receive a reference signal R and frequency-divided signal D at their clock terminals. The flip-flops FF1 and FF2 respectively output from their output terminals Q an up signal UP for raising the frequency and a down signal DOWN for lowering the frequency. The signals UP and DOWN are input to a NAND circuit NA in order to reset the flip-flops FF1 and FF2, and input to the reset terminals of the flip-flops FF1 and FF2, respectively.

Figure 5:
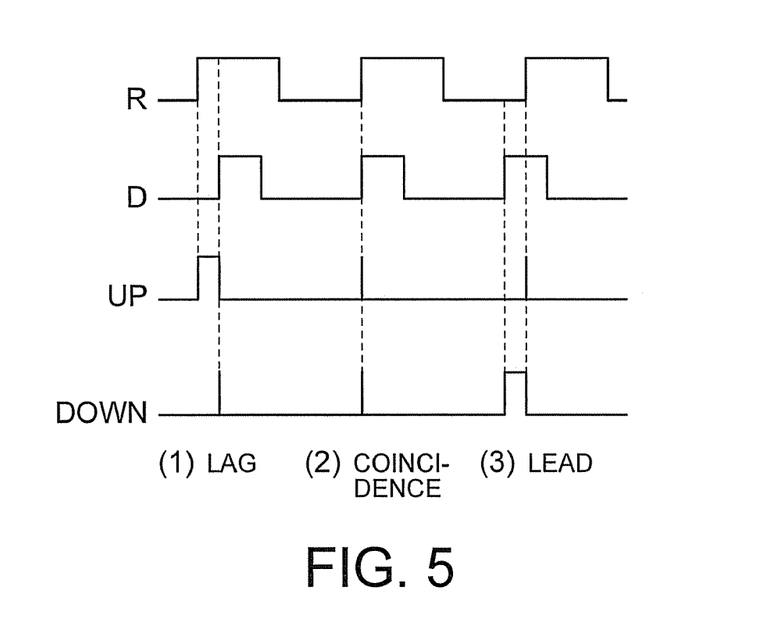
FIG. 5 is a timing chart showing the waveforms of input/output signals of the phase frequency detector shown in FIG. 4.

The up signal UP is output when the frequency-divided signal D lags behind the reference signal R as in case (1) shown in FIG. 5. The down signal DOWN is output when the frequency-divided signal D leads the reference signal R as in case (3) shown in FIG. 5.

If the two signals are in phase as in case (2), the output from the phase frequency detector is ideally zero. However, both the up signal UP and down signal DOWN are generated as shown in FIG. 5 in order to reset the flip-flops FF1 and FF2.

As described above, the normally used phase frequency detector generates an output signal even in the locked state.

The charge pump circuit CP converts this signal generated in the steady state into an electric current, and outputs the electric current as a charge pump signal I.

Figure 6:
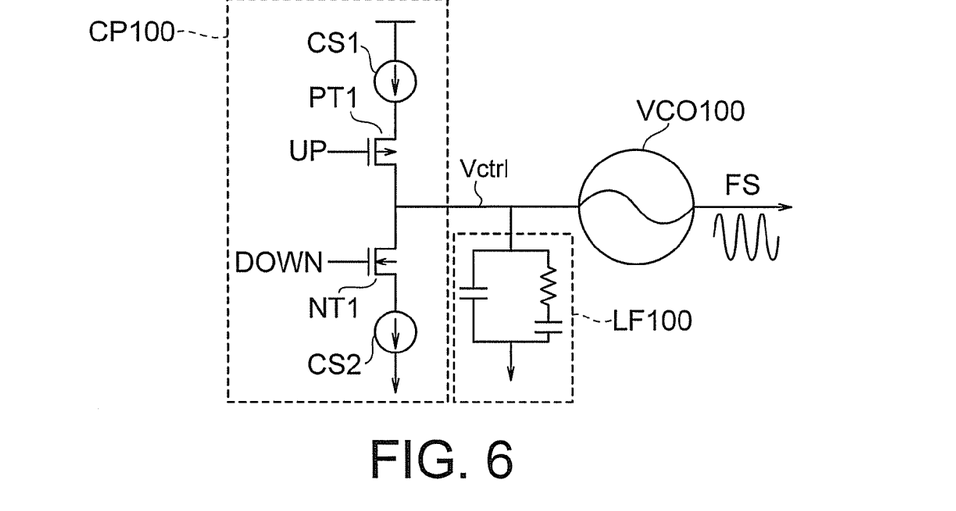
FIG. 6 is a block diagram showing the peripheral arrangement of the output terminal of a charge pump of the semiconductor device shown in FIG. 3.

In the charge pump circuit CP as shown in FIG. 6, a current source CS1, p-channel transistor PT1, n-channel transistor NT1, and current source CS2 are connected in series between the power terminal and ground terminal. The loop filter LF100 is normally connected between the output terminal of the charge pump CP100 and voltage controlled oscillator VCO100.

Figure 7:
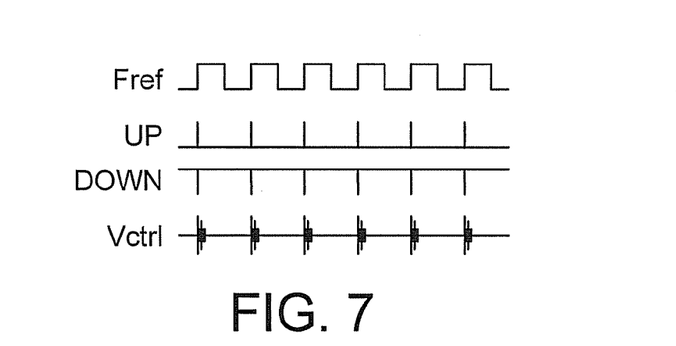
FIG. 7 is a timing chart showing the waveforms of input/output signals in the semiconductor device shown in FIG. 3.
Figure 8:
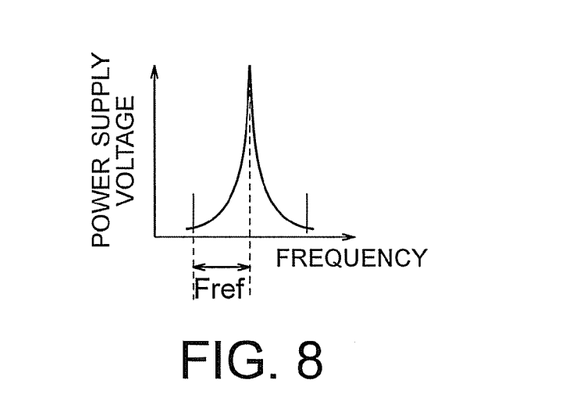
FIG. 8 is a graph showing the waveform of an output frequency signal of the semiconductor device shown in FIG. 3.

As described above, nonideal operations of the phase comparator and other circuits generate a periodic potential fluctuation in control voltage Vctr1 as shown in FIG. 7. The voltage controlled oscillator VCO converts the frequency of this potential fluctuation, and generates a spur as shown in FIG. 8.

SECOND REFERENCE EXAMPLE

Figure 9:
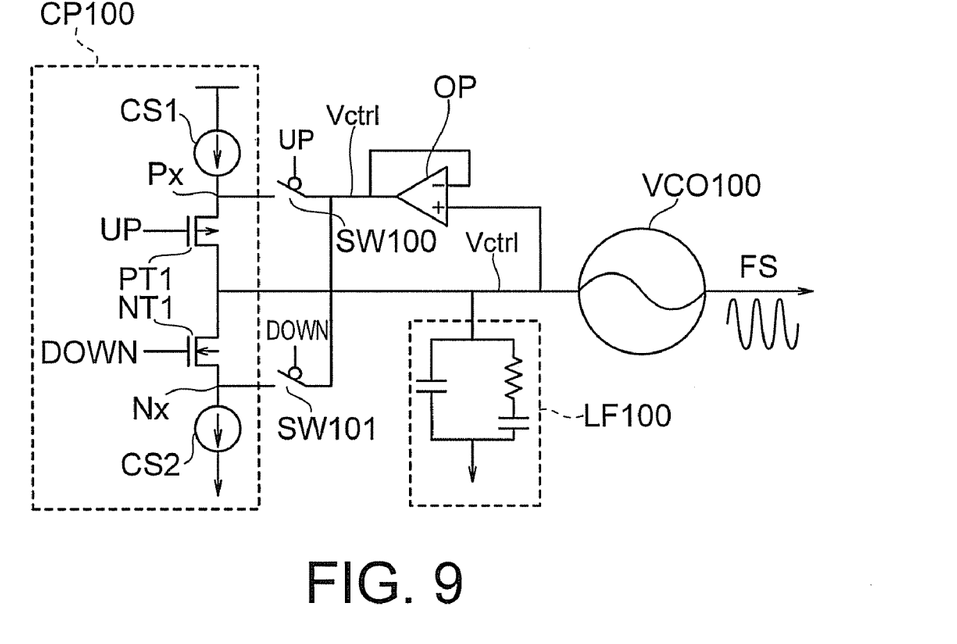
FIG. 9 is a block diagram showing the peripheral arrangement of the output terminal of a charge pump of the semiconductor device according to the second reference example.

A semiconductor device according to the second reference example will be explained below with reference to FIG. 9 as a device having an arrangement which additionally has a function of reducing the spur as described above.

An operational amplifier OP and switching elements SW100 and SW101 are formed between the output terminal of a charge pump CP100 and nodes Px and Nx. When a p-channel transistor PT1 is turned off, the switching element SW100 is turned on to set the node Px at the same potential as a control voltage Vctr1. When the p-channel transistor PT1 is turned on, the switching element SW100 is turned off. When an n-channel transistor NT1 is turned off, the switching element SW101 is turned on to set the node Nx at the same potential as the control voltage Vctr1. When the n-channel transistor NT1 is turned on, the switching element SW101 is turned off.

Ideally, electric currents flow from current sources CS1 and CS2 only when the transistors PT1 and NT1 are turned on, thereby generating no spur. However, the actual current sources are formed by MOSFETs. If there is no spur reducing function obtained by the operational amplifier OP and switching elements SW100 and SW101, therefore, the potentials of the nodes Px and Nx are respectively equal to the source potentials of the transistors forming the current sources CS1 and CS2. Accordingly, the moment the transistor PT1 or NT1 is turned on an electric charge flows and the potential of the control voltage Vctr1 changes. The flow of this electric charge, current offset existing in the current sources CS1 and CS2, or the like fluctuates the control voltage Vctr1.

To reduce this fluctuation, the second reference example feeds back the control voltage Vctr1 to the source sides of the p-channel transistor PT1 and n-channel transistor NT1, and reduces the electric current at the moment of phase comparison, i.e., the moment the transistor PT1 or NT1 is turned on, thereby suppressing the spur.

Unfortunately, the second reference example keeps consuming the electric current except for the moment of phase comparison, in order for the source sides of the transistors PT1 and NT1 to maintain the potential of the control voltage Vctr1. This increases the current consumption.

THIRD REFERENCE EXAMPLE

Figure 10:
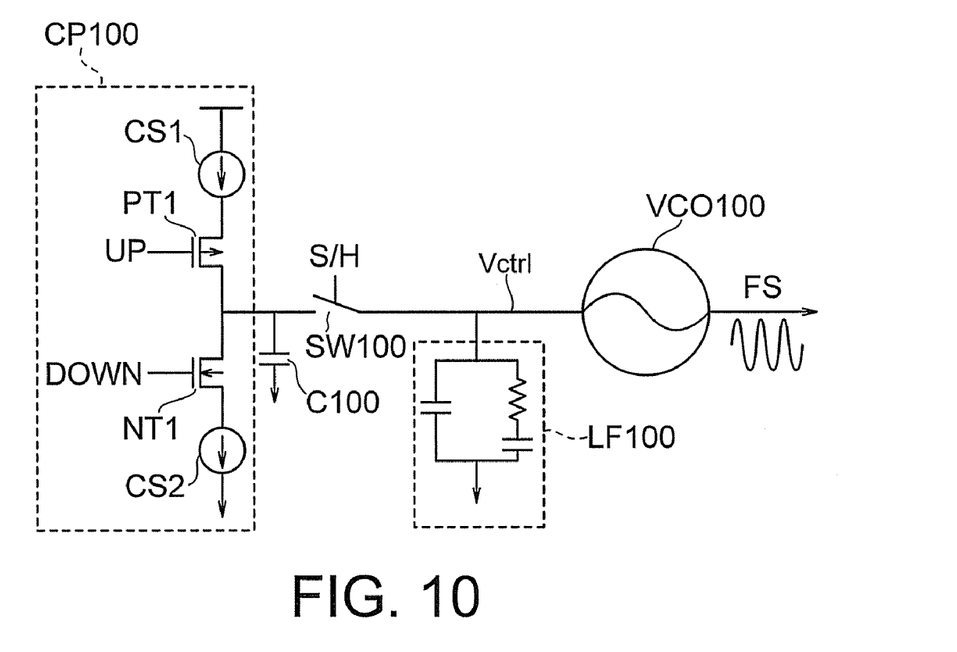
FIG. 10 is a block diagram showing the peripheral arrangement of the output terminal of a charge pump of the semiconductor device according to the third reference example.

FIG. 10 shows another spur reducing method of a semiconductor device according to the third reference example.

As described above, the p-channel transistor PT1 or n-channel transistor NT1 is turned on at the moment of phase comparison, and a fluctuation in electric current which flows from the output terminal connected to the drains of the transistors PT1 and NT1 to the input terminal of the voltage controlled oscillator VCO generates a spur.

Figure 11:
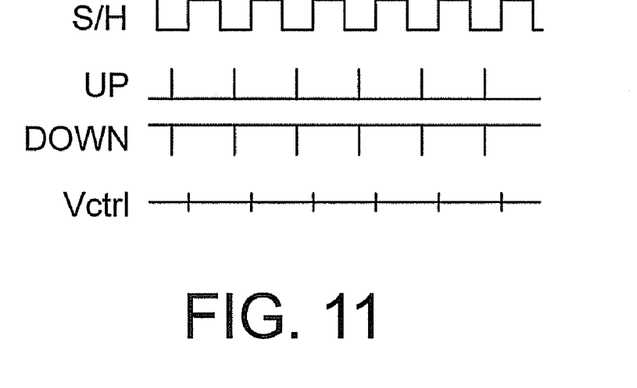
FIG. 11 is a timing chart showing the waveforms of input/output signals in the semiconductor device shown in FIG. 10.

The third reference example, therefore, controls ON/OFF of a switching element SW between the output terminal of a charge pump CP100 and the input terminal of a voltage controlled oscillator VCO, in synchronism with a sample-and-hold signal S/H which defines the timing of phase comparison as shown in FIG. 11.

At the moment of phase comparison, the switching element SW100 is turned off to electrically isolate the drain sides of transistors PT1 and NT1 from the input terminal of the voltage controlled oscillator VCO. While the switching element SW100 is OFF, a current fluctuation component is charged in or discharged from a capacitor C100. Since charge and discharge are repetitively performed, the electric charge held in the capacitor C100 is averaged and made almost zero.

When the phase comparison is complete, the switching element 100 is turned on to connect the output terminal of the charge pump CP100 and the input terminal of the voltage controlled oscillator VCO, thereby reducing the spur.

In this case, however, the capacitor C100 having a large capacitance value must be added to the semiconductor device, and this increases the device area.

FOURTH REFERENCE EXAMPLE

Figure 12:
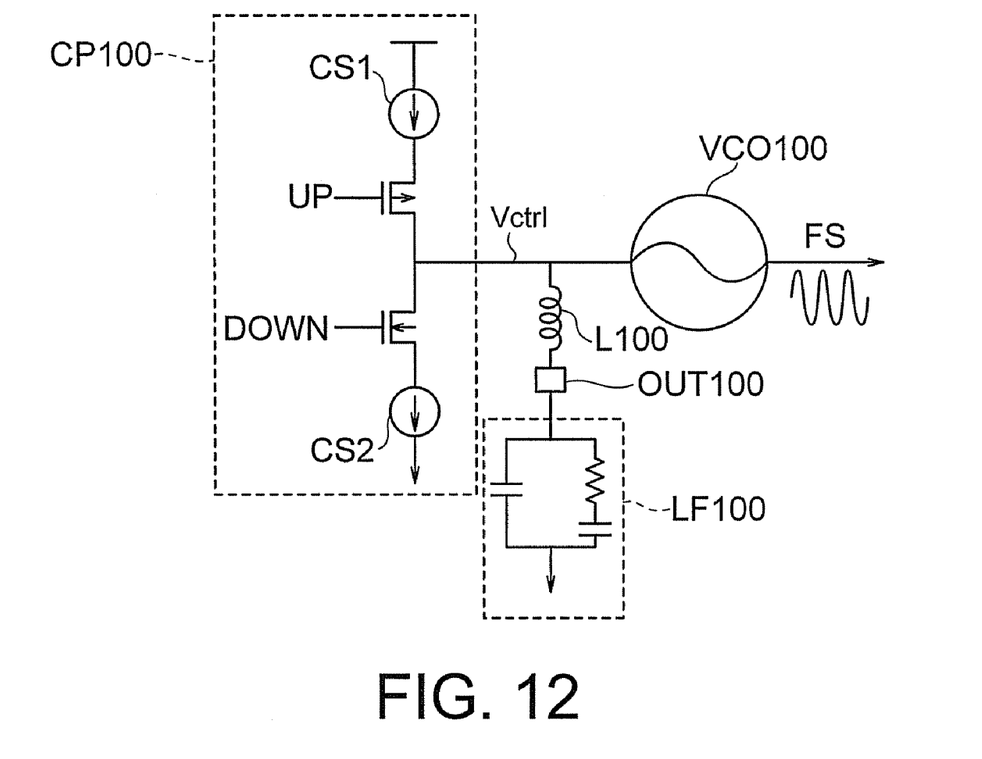
FIG. 12 is a block diagram showing the peripheral arrangement of the output terminal of a charge pump of the semiconductor device according to the fourth reference example.

FIG. 12 shows the arrangement of a semiconductor device according to the fourth reference example.

In the fourth reference example, a loop filter LF100 connects to an output pad OUT100 of a charge pump CP100. The loop filter LF100 removes a high-frequency potential fluctuation component generated in the charge pump CP100.

A parasitic inductance component L100, however, exists in a wiring path from the output side of the charge pump CP100 to the external loop filter LF100. The parasitic inductance component L100 prevents high-frequency components from flowing into the loop filter LF100 to make it unable to function as a filter. Consequently, a control voltage Vctrl containing harmonic noise components is applied to a voltage controlled oscillator VCO100, thereby generating a spur.

As described above, none of reference examples 1 to 4 can well remove the spur.

By contrast, the first embodiment described earlier isolates the control voltage Vctrl at the moment of phase comparison in the locked state, so as not to apply the control voltage Vctrl to the voltage controlled oscillator VCO. Thus, the first embodiment can greatly suppress the spur without interfering with phase control.

SECOND EMBODIMENT

Figure 13:
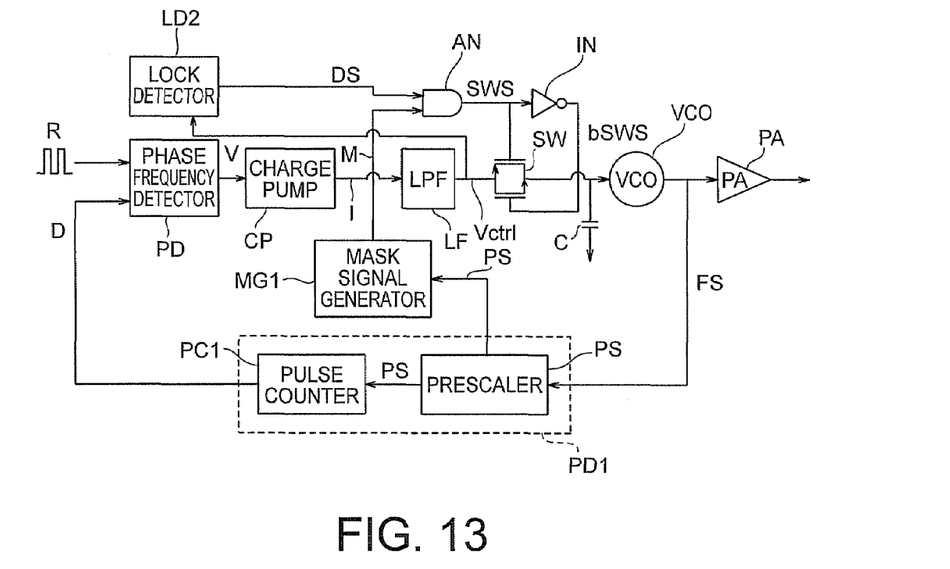
FIG. 13 is a block diagram showing the configuration of a semiconductor device according to the second embodiment of the present invention.

A semiconductor device according to the second embodiment of the present invention will be explained below with reference to FIG. 13 showing the arrangement of the device.

In the second embodiment, a lock detector LD2 detects the locked state by using an input signal different from that of the lock detector LD1 of the first embodiment.

The rest of the arrangement is the same as the first embodiment, so the same reference numerals as in the first embodiment denote the same components, and an explanation thereof will be omitted.

The lock detector LD2 receives a control voltage Vctrl output from a loop filter LF. The control voltage Vctrl is stable in the locked state as shown in FIG. 2, so the locked state can be detected by monitoring the control voltage Vctrl.

THIRD EMBODIMENT

Figure 14:
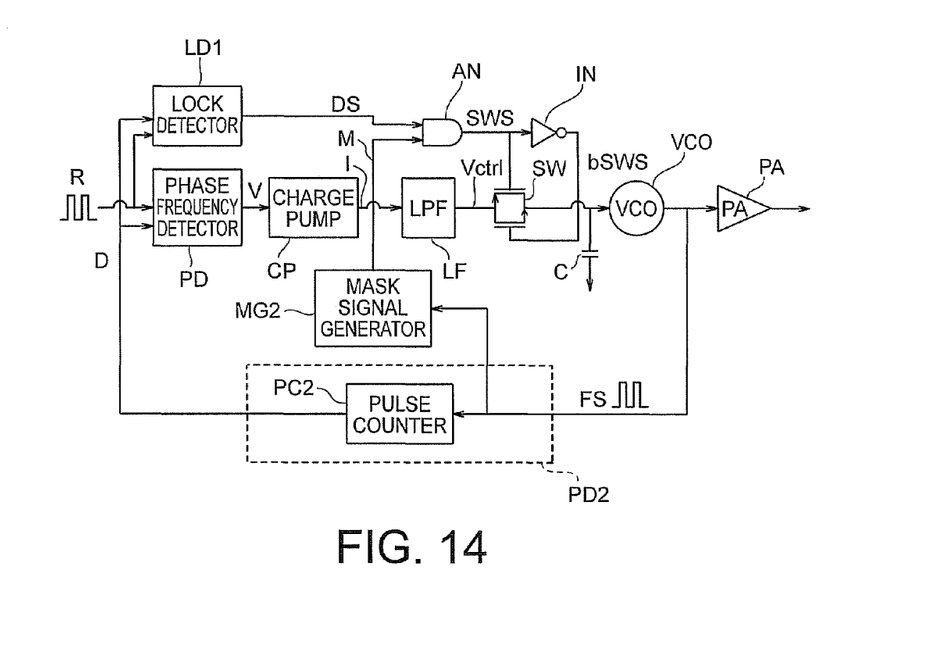
FIG. 14 is a block diagram showing the configuration of a semiconductor device according to the third embodiment of the present invention.

FIG. 14 shows the arrangement of a semiconductor device according to the third embodiment of the present invention.

The third embodiment is suitable for a case in which a frequency signal FS output from a voltage controlled oscillator VCO has a digital square wave instead of an analog waveform. In this case, a single-stage pulse counter PC2 can directly divide the frequency of the output from the voltage controlled oscillator VCO without using any prescaler.

Also, a mask signal generator MG2 directly receives the frequency signal FS output from the voltage controlled oscillator VCO, and generates a mask signal M in synchronism with this output.

As described above, the third embodiment can reduce a spur generated upon phase comparison by applying the present invention to a PLL circuit used in a digital circuit.

Note that in the configuration shown in FIG. 14, a lock detector LD1 detects the locked state by using a reference signal R and frequency-divided signal D as in the first embodiment. However, the lock detector LD1 may also be replaced with a lock detector LD2 which uses a control voltage Vctrl output from a loop filter LF as in the second embodiment.

FOURTH EMBODIMENT

Figure 15:
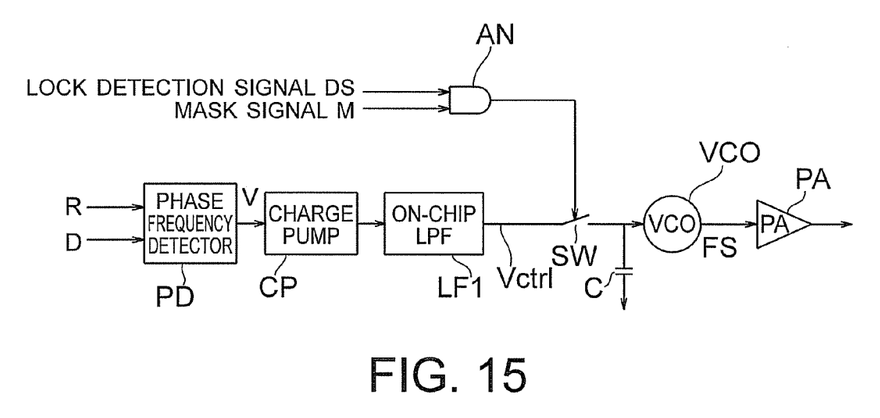
FIG. 15 is a block diagram showing the configuration of a semiconductor device according to the fourth embodiment of the present invention.

FIG. 15 shows the arrangement of a semiconductor device according to the fourth embodiment of the present invention.

In the fourth embodiment, the loop filter LF is limited to an on-chip loop filter LF1 in the arrangement of the first embodiment.

The loop filter LF1 must ensure a 1/CR value in order to attenuate components having frequencies equal to or higher than a predetermined frequency. However, a capacitance value C of the on-chip loop filter is limited by the area, so a resistance value R must be increased. Consequently, the potential fluctuation of the on-chip loop filter LF1 increases for the same current change, and this often increases the fluctuation component of a control voltage Vctrl.

In the fourth embodiment, however, as in the first embodiment, an AND circuit AN ANDs a mask signal M masking the timing of phase comparison and a lock detection signal DS, thereby controlling ON/OFF of a switching element SW between the loop filter LF1 and a voltage controlled oscillator VCO. This isolates the control voltage Vctrl upon phase comparison in the locked state, so as not to apply the control voltage Vctrl to the voltage controlled oscillator VCO. Even when the on-chip loop filter LF1 is used, therefore, it is possible to increase the resistance value R forming the filter while the loop band is held constant, and reduce the capacitance C instead, thereby decreasing the device area and suppressing the spur signal.

In the fourth embodiment, it is possible to use a lock detector LD1 which detects the locked state by using a reference signal R and frequency-divided signal D as in the first embodiment, or a lock detector LD2 which uses the control voltage Vctrl output from the loop filter LF as in the second embodiment.

Also, a mask signal generator MG can be a mask signal generator MG1 which uses an output prescaler signal from a prescaler PS as in the first and second embodiments, or a mask signal generator MG2 which uses a frequency signal FS output from the voltage controlled oscillator VCO as in the third embodiment.

FIFTH EMBODIMENT

Figure 16:
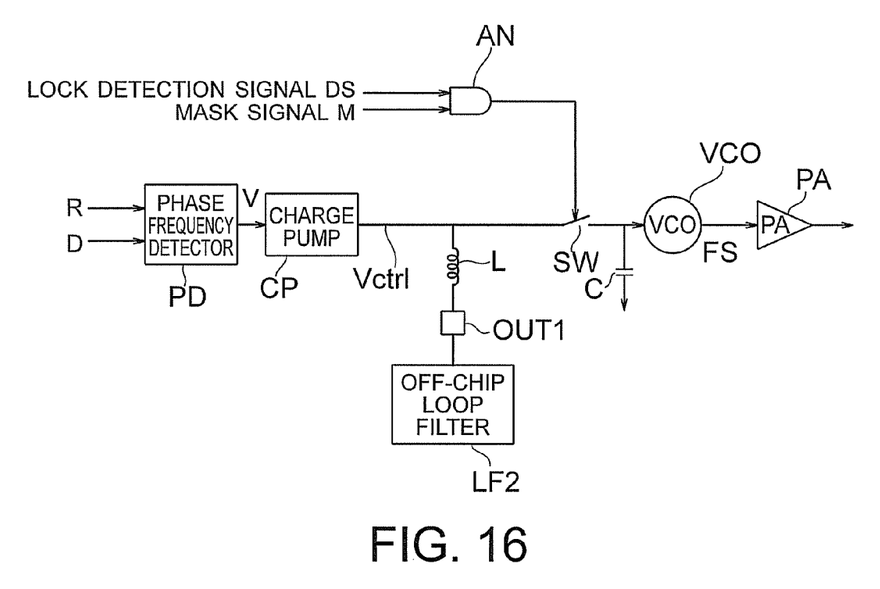
FIG. 16 is a block diagram showing the configuration of a semiconductor device according to the fifth embodiment of the present invention.

A semiconductor device according to the fifth embodiment of the present invention will be explained below with reference to FIG. 16 showing the arrangement of the device.

The fifth embodiment differs from the fourth embodiment in that an off-chip loop filter LF2 is used.

When the off-chip loop filter LF2 is formed outside a chip, a parasitic inductance component L exists in a wiring path extending from the output terminal of a charge pump CP to the loop filter LF2 via an output pad OUT1. When the off-chip loop filter LF2 is used, therefore, the parasitic inductance L makes the loop filter LF2 unable to well remove harmonic noise components contained in a control voltage Vctr1 output from the charge pump PC.

As in the case explained in the first embodiment, however, the fifth embodiment does not apply the control voltage Vctr1 to a voltage controlled oscillator VCO upon phase comparison in the locked state, thereby suppressing the spur signal even when the off-chip loop filter LF2 is used.

In the fifth embodiment, it is possible to use a lock detector LD1 which detects the locked state by using a reference signal R and frequency-divided signal D as in the first embodiment, or a lock detector LD2 which uses the control voltage Vctr1 output from the loop filter LF as in the second embodiment. Also, a mask signal generator MG can be a mask signal generator MG1 which uses an output prescaler signal from a prescaler PS as in the first and second embodiments, or a mask signal generator MG2 which uses a frequency signal output from the voltage controlled oscillator VCO as in the third embodiment.

The semiconductor devices according to the first to fifth embodiments can reduce the spur generated upon phase comparison.

The above embodiments are merely examples and do not limit the present invention. Therefore, these embodiments can be variously modified within the technical scope of the invention.

What is claimed is:

1. A semiconductor device comprising:
a phase locked loop circuit having
a phase frequency detector which receives a reference signal and a frequency-divided signal, and outputs a phase difference detection signal between the reference signal and the frequency-divided signal,
a charge pump which receives the phase difference detection signal and outputs a charge pump signal by converting a voltage change into a current change,
a loop filter which receives the charge pump signal, and outputs a control voltage by passing frequencies not more than a predetermined frequency,
a voltage controlled oscillator which outputs a frequency signal having a frequency based on the control voltage, and
a frequency divider which receives the frequency signal, and outputs the frequency-divided signal by dividing the frequency;
a mask signal generator which generates a mask signal masking a timing at which said phase frequency detector compares phases of the frequency-divided signal and the reference signal;
a lock detector which detects a locked state of said phase locked loop circuit and outputs a lock detection signal; and
an isolating circuit which receives the mask signal and the lock detection signal, and electrically isolates the output of said loop filter and the input of said voltage controlled oscillator from each other upon phase comparison in the locked state.

2. A device according to claim 1, wherein said lock detector detects the locked state of said phase locked loop circuit and outputs the lock detection signal on the basis of the frequency-divided signal and the reference signal.

3. A device according to claim 1, wherein said lock detector detects the locked state of said phase locked loop circuit and outputs the lock detection signal on the basis of the control voltage output from said loop filter.

4. A device according to claim 1, wherein
said frequency divider has a single-stage counter which receives the frequency signal, divides the frequency by counting the frequency, and outputs the frequency-divided signal, and
said mask signal generator generates the mask signal in synchronism with the frequency signal from said voltage controlled oscillator.

5. A device according to claim 2, wherein
said frequency divider has a single-stage counter which receives the frequency signal, divides the frequency by counting the frequency, and outputs the frequency-divided signal, and
said mask signal generator generates the mask signal in synchronism with the frequency signal from said voltage controlled oscillator.

6. A device according to claim 3, wherein
said frequency divider has a single-stage counter which receives the frequency signal, divides the frequency by counting the frequency, and outputs the frequency-divided signal, and
said mask signal generator generates the mask signal in synchronism with the frequency signal from said voltage controlled oscillator.

7. A device according to claim 1, wherein said loop filter is one of an on-chip loop filter incorporated into the same chip as said phase locked loop circuit, and an off-chip loop filter formed outside the chip of said phase locked loop circuit.

8. A device according to claim 2, wherein said loop filter is one of an on-chip loop filter incorporated into the same chip as said phase locked loop circuit, and an off-chip loop filter formed outside the chip of said phase locked loop circuit.

9. A device according to claim 3, wherein said loop filter is one of an on-chip loop filter incorporated into the same chip as said phase locked loop circuit, and an off-chip loop filter formed outside the chip of said phase locked loop circuit.

10. A semiconductor device comprising:
a phase locked loop circuit having
a phase frequency detector which receives a reference signal and a frequency-divided signal, and outputs a phase difference detection signal between the reference signal and the frequency-divided signal,
a charge pump which receives the phase difference detection signal and outputs a charge pump signal by converting a voltage change into a current change,
a loop filter which receives the charge pump signal, and outputs a control voltage by passing frequencies not more than a predetermined frequency,
a voltage controlled oscillator which outputs a frequency signal having a frequency based on the control voltage, and
a frequency divider having at least a single-stage counter which receives the frequency signal, divides the frequency by counting the frequency, and outputs the frequency-divided signal;

a mask signal generator which generates a mask signal masking a timing at which said phase frequency detector compares phases of the signal from said frequency divider and the reference signal, in synchronism with one of the frequency signal from said voltage controlled oscillator and the signal generated by said frequency divider;

a lock detector which detects a locked state of said phase locked loop circuit and outputs a lock detection signal;

a logic circuit which receives the mask signal and the lock detection signal, and passes the mask signal in the locked state; and a switching element formed between an output terminal of said loop filter and an input terminal of said voltage controlled oscillator, and turned on and off on the basis of the mask signal output from said logic circuit, wherein said loop filter and said voltage controlled oscillator are isolated from each other upon phase comparison in the locked state so as not to apply the control voltage to said voltage controlled oscillator.

11. A device according to claim 10, wherein said lock detector detects the locked state of said phase locked loop circuit and outputs the lock detection signal on the basis of the frequency-divided signal and the reference signal.

12. A device according to claim 10, wherein said lock detector detects the locked state of said phase locked loop circuit and outputs the lock detection signal on the basis of the control voltage output from said loop filter.

13. A device according to claim 10, wherein said frequency divider has a single-stage counter which receives the frequency signal, divides the frequency by counting the frequency, and outputs the frequency-divided signal, and said mask signal generator generates the mask signal in synchronism with the frequency signal from said voltage controlled oscillator.

14. A device according to claim 11, wherein said frequency divider has a single-stage counter which receives the frequency signal, divides the frequency by counting the frequency, and outputs the frequency-divided signal, and said mask signal generator generates the mask signal in synchronism with the frequency signal from said voltage controlled oscillator.

15. A device according to claim 12, wherein said frequency divider has a single-stage counter which receives the frequency signal, divides the frequency by counting the frequency, and outputs the frequency-divided signal, and said mask signal generator generates the mask signal in synchronism with the frequency signal from said voltage controlled oscillator.

16. A device according to claim 10, wherein said loop filter is one of an on-chip loop filter incorporated into the same chip as said phase locked loop circuit, and an off-chip loop filter formed outside the chip of said phase locked loop circuit.

17. A device according to claim 11, wherein said loop filter is one of an on-chip loop filter incorporated into the same chip as said phase locked loop circuit, and an off-chip loop filter formed outside the chip of said phase locked loop circuit.

18. A device according to claim 12, wherein said loop filter is one of an on-chip loop filter incorporated into the same chip as said phase locked loop circuit, and an off-chip loop filter formed outside the chip of said phase locked loop circuit.

* * * * *